United States Patent [19]

Allen et al.

[11] 3,877,050

[45] Apr. 8, 1975

[54] INTEGRATED CIRCUIT HAVING GUARD RING SCHOTTKY BARRIER DIODE AND METHOD

[75] Inventors: Richard John Allen; Michael Anthony Shields, both of Sunnyvale, Calif.

[73] Assignees: Signetics Corporation, Sunnyvale, Calif.; Corning Glass Works, Corning, N.Y. ; part interest to each

[22] Filed: Aug. 27, 1973

[21] Appl. No.: 392,110

[52] U.S. Cl. ...................... 357/15; 357/46; 357/48; 357/52; 357/68; 357/71

[51] Int. Cl. .......................... H01l 5/02; H01l 19/00

[58] Field of Search... 317/235 UA, 234 M; 357/15, 357/67, 68, 71

[56] References Cited

UNITED STATES PATENTS

| | | | |
|---|---|---|---|
| 3,463,971 | 8/1969 | Soshea et al. | 317/235 UA |
| 3,463,975 | 8/1969 | Biard | 317/235 UA |
| 3,506,893 | 4/1970 | Dhaka | 317/235 UA |
| 3,518,506 | 6/1970 | Gates | 317/234 M |
| 3,737,742 | 6/1973 | Breuer et al. | 317/235 UA |
| 3,780,320 | 12/1973 | Dorler et al. | 317/235 UA |
| 3,781,825 | 12/1973 | Bårker et al. | 317/235 UA |

*Primary Examiner*—John Zazworsky
*Assistant Examiner*—William D. Larkins
*Attorney, Agent, or Firm*—Flehr, Hohbach, Test, Albritton & Herbert

[57] ABSTRACT

Integrated circuit having a guard ring Schottky barrier diode therein in which first and second layers of metallization are provided overlying the Schottky barrier diode which are brought into intimate contact with the interconnect surface to establish intimate contact between the surface of the semiconductor body and the metallization.

3 Claims, 7 Drawing Figures

INTEGRATED CIRCUIT HAVING GUARD RING SCHOTTKY BARRIER DIODE AND METHOD

BACKGROUND OF THE INVENTION

Schottky barrier diodes have heretofore been utilized in many integrated circuits. However, there is a difficulty in forming such Schottky barrier diodes economically and particularly in forming such Schottky barrier diodes which will not degrade in subsequent thermal treatments which occur during subsequent fabrication and assembly operations in packaging integrated circuits. There is, therefore, a need for a new and improved integrated circuit construction having Schottky barrier diodes therein.

SUMMARY AND OBJECTS OF THE INVENTION

The integrated circuit having a guard ring Schottky barrier diode therein consists of a semiconductor body of one conductivity type and having a planar surface. A region of opposite conductivity type is formed in the semiconductor body which extends to the surface and circumscribes a region of said one conductivity type of the body. A layer of insulating material is formed on the surface. An opening is formed in the layer of insulating material which has its edge overlying the region of opposite conductivity type. A first layer of metallization is formed on the surface and extends into the opening and makes intimate contact with the surface overlying the region of opposite conductivity type and the region of one conductivity type circumscribed by the region of opposite conductivity type. An additional layer of insulating material overlies the first layer of insulating material and the first layer of metallization. An opening is formed in the second layer of metallization which has an edge which overlies the region circumscribed by the region of opposite conductivity type. A second layer of metallization is formed in the opening and makes intimate contact with the first layer of metallization.

In the method, two annealing operations are utilized after each of the first and second layers of metallization are deposited to establish an intimate contact between the surface of the semiconductor body and the interconnect metal.

In general, it is an object of the present invention to provide an integrated circuit construction having a Schottky barrier diode or a Schottky clamped transistor therein which is relatively economical to fabricate.

Another object of the invention is to provide an integrated circuit construction and method of the above character in which the Schottky barrier diode or Schottky clamped transistor does not degrade upon subsequent thermal treatments.

Additional objects and features of the invention will appear from the following description in which the preferred embodiment is set forth in detail in conjunction with the accompanying drawings.

DESCRIPTION OF THE PREFERRED EMBODIMENT

Figure 1:
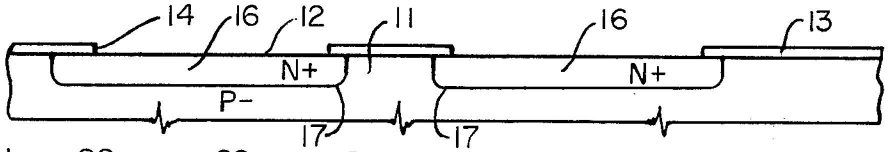
FIGS. 1-6 are cross-sectional views showing the steps utilized in fabricating an integrated circuit construction having a Schottky barrier diode therein incorporating the present invention.
Figure 2:
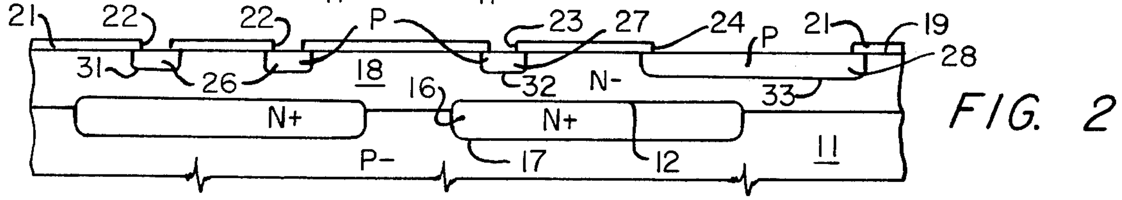
Figure 3:
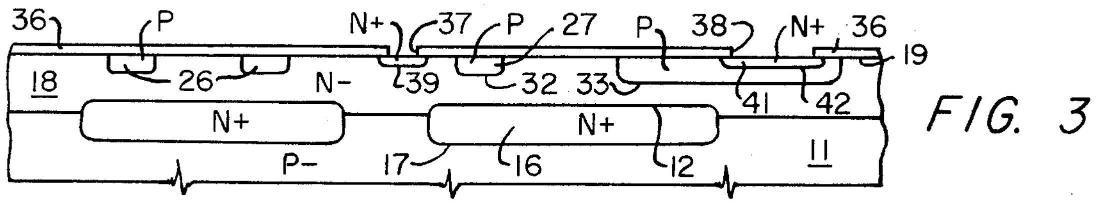

The integrated circuit which includes a Schottky barrier diode is fabricated by utilizing a semiconductor body 11 in the form of a wafer of a suitable material such as P-type silicon which is provided with a planar surface 12. A layer 13 of a suitable masking material such as thermally grown silicon dioxide is provided on the surface 12. Openings 14 are formed in the silicon dioxide layer 13 by conventional photolithographic techniques. A suitable N-type impurity such as arsenic is then diffused through the openings 14 to provide N-type regions 16 in the semiconductor body which are defined by substantially dish-shaped PN junctions 17 which extend to the surface to provide what is conventionally called a buried layer.

The method and structure of this invention are applicable not only to guard ring Schottky diodes, but also to guard ring Schottky clamped transistors. In the drawings there is illustrated formation of both such a diode and transistor utilizing the teachings of the invention. Therefore, there is shown in FIG. 1 two of the buried layers 16, one of which underlies the subsequently formed guard ring Schottky diode and the other of which underlies the subsequently formed guard ring Schottky clamped transistor. Throughout the following description the processing steps necessary for formation of both a guard ring Schottky barrier diode and a guard ring Schottky clamped transistor are described. It should be understood, however, that the invention relates to formation of either the Schottky diode or the Schottky clamped transistor and not necessarily the simultaneous formation of both.

Thereafter, the silicon dioxide layer 13 is stripped from the surface 12 and an epitaxial layer 18 containing a suitable N-type impurity is then formed on the surface 12 of the body 11 in a conventional manner to provide a planar surface 19. A mask 21 of a suitable material such as thermally grown, silicon dioxide is provided on the surface 19. Openings 22, 23 and 24 are then formed in the silicon dioxide layer by conventional photolithographic techniques to expose the surface 19. Rectangular geometry is utilized so as to conform to the layout rules hereinafter specified. However, circular geometry or other types of geometry can be utilized as long as the opening 22 defines a continuous ring. A P-type impurity is then diffused through the openings 22, 23 and 24 to provide P-type regions 26, 27 and 28 within the epitaxial layer 18 which are defined by dish-shaped PN junctions 31, 32 and 33 which extend to the surface 19. The P-type region 26 forms the guard ring which is utilized as hereinafter described. The region 27 together with region 28 forms a guard ring and functions as the base of a transistor to be formed in the integrated circuit.

After formation of the P-type regions, the silicon dioxide layer 21 is removed and a new mask 36 of a suitable material such as thermally grown silicon oxide is provided. Openings 37 and 38 are formed in the oxide layer 36 by conventional photolithographic techniques to expose the surface 19. A suitable N-type impurity is then diffused through the openings 37 and 38 to form N+ regions 39 and 41. The region 41 is defined by a substantially dish-shaped PN junction 42 extending to the surface 19. The region 39 serves as a contact to the guard ring Schottky diode formed in the left hand portion of the drawings, whereas the region 41 serves as the emitter of a Schottky clamped transistor in the right hand portion of the drawings.

The silicon dioxide layer 36 can be stripped and another silicon dioxide layer 43 formed on the surface 19. Opening 44 is formed in the silicon dioxide layer 43 and is of a relatively large size so that it extends over the inner edges of the ring 26 and, in addition, uncovers all the area at the surface 19 which is within the confines of the ring 26. Similarly, the opening 47 formed in silicon dioxide layer 43 is of a relatively large size so that it extends over the inner edges of the ring formed by regions 27 and 28 and, in addition, uncovers all the area at the surface 19 which is within the confines of the ring formec by regions 27 and 28. At the same time, if desired, additional openings 46 and 49 can be provided in the mask 43. Thereafter, suitable metallization such as a layer of aluminum is deposited on the surface of the mask 43 and into the openings 44, 46, 47 and 49 into contact with the surface 19 exposed by the openings. By conventional photolithographic techniques, the undesired metal is removed so that there remains metallization 51 overlying the ring 26, metallization 54 overlying the ring formed in the transistor, metallization 52 forming a contact to the diode, and metallization 56 forming an emitter contact to the transistor. From the foregoing, it can be seen that the metallization which has been provided can be considered as a first layer of metallization.

Figure 4:
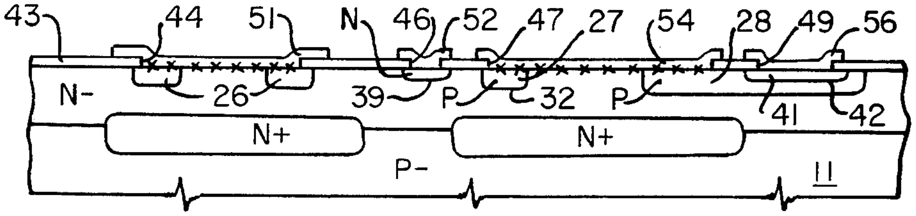
Figure 5:
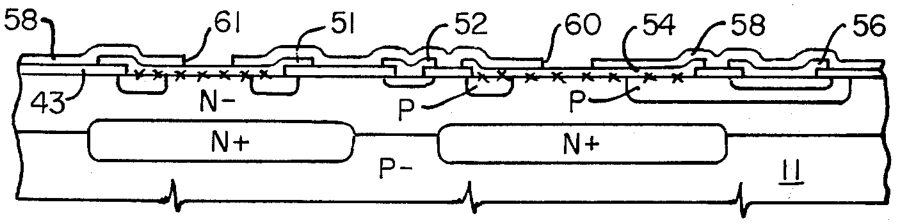

After the metallization has been carried out as shown in FIG. 4, the integrated circuit wafer or semiconductor body 11 is sintered at a temperature ranging from 425° to 555°C, preferably at approximately 450°C for a period ranging from 10 minutes to approximately 2 hours but preferably at approximately one-half hour or longer. It has been found that when silicon is covered by aluminum and is sintered at such a temperature, pitting occurs in the region indicated by X's where aluminum makes contact with the silicon. It is believed that this pitting occurs because of the dissolution of silicon into the aluminum in these areas. The density of pitting indicates the degree to which ohmic contact is made. The density of pitting is greater closer to the edges of the contact between the aluminum and the silicon where a greater bulk of aluminum exists for dissolving silicon. In case of the guard ring 26, the greatest density of pitting occurs in the P-type guard ring 26, whereas the contact to the diode proper is relatively poor. This has been observed in the distribution of the pitting over the contact area. Similarly, the greatest density of pitting for the transistor occurs in the P-type guard ring formed by the regions 27 and 28.

As soon as the sintering step has been completed, a layer 58 of a suitable insulating material such as vapor deposited silicon dioixde is formed over the entire wafer from which the semiconductor body 11 is being fabricated. This layer 58 serves to prevent critical damage to the metallization which has been provided on the first layer 43. In addition, it can be utilized to provide two or more layers of metallization which may be necessary in the integrated circuit. A via or hole 61 is then etched through the dielectric layer 58 in a region overlying the surface 19 which is within the confines of the area within the P-type region 26 to expose the upper surface of the metallization 51. Likewise, for the case of the transistor a via or hole 60 is etched through the dielectric layer 58 in a region overlying the surface 19 which is within the confines of the area within the guard ring formed by regions 27 and 28 to expose the upper surface of the metallization 54. Thereafter, a second layer of metallization in the form of an aluminum layer is formed on the surface of the dielectric layer 58 and into the via or hole 61 and the via or hole 60 so that it comes into contact with the exposed metallization within the via or hole 61 and the via or hole 60. The undesired metal is removed by conventional photolithographic techniques so that there remains metallization 62 and metallization 65.

Typically, the via 61 can be of a size in the order of 15 × 50 or 60 microns. The space between the via 61 and the inner edge of the P-type region 26 should be such so that there is at least 4 microns separation between the inside edge of the P-type region 26 and the outer extremity of the via 61. It has been found that the thickness of the layer 62 is relatively unimportant as long as it forms a satisfactory layer. The second layer of metallization 62 preferably overlaps the via 61 by a suitable margin as, for example, 10 to 20 microns. It is believed that the bigger the second layer of metallization 62, the more satisfactory the results. Similar dimension considerations obtain in applying the invention to a transistor, i.e. via 60 and metallization 65.

Figure 6:
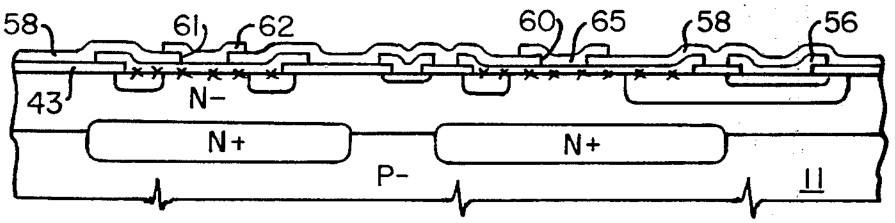

After the second layer of metallization 62 and 65 has been provided, the structure which is shown in FIG. 6 is subjected to a second sintering operation at approximately the same temperature and time as the first sintering operation. This second sintering step causes an additional bulk of aluminum from the second layer of metallization 62 and 65 to be brought into contact with the first layer of metallization 51 and 54 and with the N-area within the confines of the P-type guard ring 26 of the Schottky barrier diode through the via 61 which previously had been formed and with the N area within the confines of the P-type guard ring formed by regions 27 and 28 of the Schottky clamped transistor through the previously formed via 60. This subsequent sintering operation produced further pitting in this area so that intimate contact is made between the aluminum and the N-silicon and contrary to the conventional case, there is no degradation in the degree of contact (diode series resistance) on subsequent thermal cycling of the structure. This completes the fabrication of the integrated circuit. Thereafter, it can be tested and packaged in a conventional manner.

Figure 7:
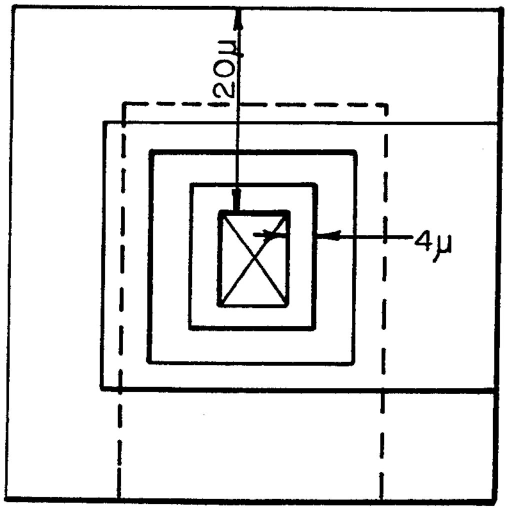
FIG. 7 is a partial plan view of the construction shown in FIG. 6.

In FIG. 7, there is shown a plan view of the Schottky barrier diode portion of the integrated circuit in which the size of the via 61 is represented by a cross in which typical 4 micron and 20 micron dimensions are shown.

The present invention has made it possible to provide a Schottky barrier diode or a Schottky clamped transistor with an offset voltage which does not change with subsequent thermal cycling of the integrated circuit.

By way of example, Schottky barrier diodes constructed in accordance with the present invention upon fabrication had a barrier height of 0.76 electron volts and a series resistance of 19.5 ohms. After the thermal cycling which occurs during subsequent processing of the integrated circuits in packaging the same, the barrier height had decreased to 0.75 electron volts or a difference of 0.01 electron volts, whereas the Schottky series resistance had improved from 19.5 to 18 ohms.

From the foregoing, it can be seen that a number of additional steps have been provided in fabricating the integrated circuit with the Schottky barrier diode. Basically, it consists of bringing a second layer of aluminum into contact with the first layer of aluminum entirely within the confines of the P-type guard ring of the Schottky barrier diode or of the Schottky clamped transistor. The aluminum is brought into excellent contact with the silicon by causing a pitting reaction at the aluminum-silicon interconnect surface. This takes place predominantly along the edges of the oxide step but also takes place in the N-area. This latter pitting is caused principally by bringing the outer edge of the dielectric from the layer 58 within the confines of the N-area so that the pitting will occur at this edge within the N-area. In this way, exaggerated pitting is produced within the confines of the N-area as well as within the P-type guard ring.

From the foregoing it also can be seen that when the integrated circuit is sufficiently complicated that two layers of interconnection are required, the present Schottky barrier diode construction can be obtained without any increase in manufacturing costs in view of the fact that two layers of metallization are required for the two-level interconnect for the integrated circuit. Even when only a single interconnect is required for the integrated circuit, the additional steps required for producing the present improved Schottky barrier diode in an integrated circuit produce a sufficiently improved integrated circuit that the additional steps are warranted.

We claim:

1. In an integrated circuit construction, a silicon semiconductor body of one conductivity type and having a planar surface, a region of opposite conductivity type formed in the body and providing a substantially continuous ring at the surface of the body which surrounds a portion of the body of one conductivity type at the surface of the body, a layer of insulating material disposed on said surface, a hole formed in said insulating layer and exposing said surface of said body, said hole being defined by an edge which is outside the inner edge of said region of opposite conductivity type in the body, metallization formed of aluminum disposed on said layer of insulating material and extending into said hole and making contact with said surface of said body and in intimate contact with said surface overlying said region of opposite conductivity type and the region of one conductivity type surrounded by said region of opposite conductivity type, said intimate contact between said metallization and said surface being characterized by having pits therein and by no substantial degradation in the degree of contact during thermal cycling, an additional layer of insulating material carried by said first named layer of insulating material, a via formed in said additional layer of insulating material, said via being defined by an edge which overlies said portion of said body of one conductivity type surrounded by said region of opposite conductivity type, and an additional layer of metallization formed of aluminum disposed on said additional layer of insulating material and making contact with said first named layer of metallization.

2. A circuit as in claim 1 wherein said edge defining said via is within the confines of the region of opposite conductivity type.

3. A circuit as in claim 1 wherein rectangular geometry is utilized.

* * * * *